United States Patent [19]

McShane

[11] Patent Number: 4,661,192
[45] Date of Patent: Apr. 28, 1987

[54] LOW COST INTEGRATED CIRCUIT BONDING PROCESS

[75] Inventor: Michael B. McShane, Austin, Tex.
[73] Assignee: Motorola, Inc., Schaumburg, Ill.
[21] Appl. No.: 768,262
[22] Filed: Aug. 22, 1985
[51] Int. Cl.$^4$ .................... H01L 23/10; H01R 43/02
[52] U.S. Cl. .................... 156/292; 29/827; 156/330; 357/80; 361/411
[58] Field of Search .............. 156/276, 291, 330, 292, 156/244.22; 361/411, 402, 398; 29/827; 174/68.5; 357/80, 74

[56] References Cited

U.S. PATENT DOCUMENTS

| T955,008 | 2/1977 | Gregor et al. ............... 357/80 |
|---|---|---|
| 3,292,240 | 12/1966 | McNutt et al. ............... 361/411 X |
| 3,303,393 | 2/1967 | Hymes et al. ............... 361/411 |
| 3,373,481 | 3/1968 | Lins et al. ............... 361/411 X |
| 3,429,040 | 2/1969 | Miller ............... 361/411 X |
| 4,074,342 | 2/1978 | Honn et al. ............... 361/411 |
| 4,285,002 | 8/1981 | Campbell ............... 29/827 X |
| 4,457,796 | 7/1984 | Needham ............... 156/276 X |

FOREIGN PATENT DOCUMENTS

| 2415120 | 10/1975 | Fed. Rep. of Germany ...... 361/411 |
|---|---|---|
| 58-159355 | 9/1983 | Japan ............... 29/827 |
| 2097998 | 10/1982 | United Kingdom ............... 357/80 |

OTHER PUBLICATIONS

DeBoskey, W. R., "Directly Attached Integrated Circuit Lead Frame", IBM Tech. Discl. Bull., vol. 15, No. 1, Jun. 1972, pp. 307.
Berndlmaier, et al., "High Performance Package", IBM Tech. Discl. Bull., vol. 20, No. 8, Jan. 1978, p. 3090.
Stephans, E., "Pinless Module Connector", IBM Tech. Discl. Bull., vol. 20, No. 10, Mar. 1978, pp. 3872.

Primary Examiner—Donald E. Czaja
Assistant Examiner—Ramon R. Hoch
Attorney, Agent, or Firm—John A. Fisher; Jeffrey Van Myers; David L. Mossman

[57] ABSTRACT

A low cost process for bonding a plurality of integrated circuit die to a variety of die support frames using existing, readily available equipment. Tape automatic bonding (TAB) processes offer a number of new possibilities in the assembly and packaging of integrated circuits. However, the investigation of TAB techniques or the use of TAB techniques on low volume parts is prohibited by the high cost of "bumping" or putting interconnection balls on the chip or the tape leads. The process permits placing balls on the bonding pads of a plurality of die by a wire bonder, cutting off the wire, planarizing the balls, coating the planarized region with a conductive epoxy and then registering and bonding the die to corresponding conductive patterns on die support frames.

5 Claims, 4 Drawing Figures

LOW COST INTEGRATED CIRCUIT BONDING PROCESS

FIELD OF THE INVENTION

The invention relates to methods for bonding an integrated circuit chip or die to a lead frame or lead tape and more particularly relates to low cost techniques for bonding chips to lead tape using readily available equipment.

BACKGROUND OF THE INVENTION

Various methods have been proposed for electrically connecting the bonding pads of an integrated microcircuit and the external package leads, as well as providing physical support and protective housing for the circuit. Traditionally, this connection has been achieved by establishing a very fine wire contact between a bonding pad of the semiconductor device and a narrow lead finger of a lead frame, where the lead frame finger gradually widens and becomes substantial enough to form the external package leads. These wire bonding techniques involve the thermocompression and thermosonic bonding of extremely fine wires to the points to be interconnected. However, this method is time-consuming and expensive, particularly when it is realized that for a 64-lead device, for example, 128 separate bonding steps are needed, each of which requires the careful positioning of the partially assembled device in the bonding apparatus.

An alternate approach is to directly bond the bonding pads of the integrated circuit chip with the interior terminals of the die support frame. In the discussion of the art and the invention herein, the term "die support frame" will be used as a generic term meaning any support frame, chip interconnection armature, etc. for an integrated circuit chip that involves any kind of metallized interconnection between the integrated circuit die and the exterior package. Thus a die support frame could be a lead frame in the traditional sense of that term or the die support frame could be the body of a chip carrier package or any standard package made of ceramic or plastic having leads formed thereon or the die support frame could be a glass plate, as in the instance where integrated circuits are directly used to provide electronic displays where the chip is electrically connected to leads borne by the glass.

As integrated circuit technology advanced, requiring more electronic devices on a smaller silicon chip, other possibilities for connecting to the semiconductor bonding pads were explored. One method which has gained wide acceptance, at least for relatively low lead-count semiconductor devices, is tape automatic bonding or TAB. This technique involves making flexible lead carrier tape having a photo-lithographically produced printed circuit pattern of conductive flexible foil thereon which is very accurate. In contrast to the lead frame thickness, the thickness of the TAB foil leads is typically in the range of about 0.5 to 2.0 mil, often about 1.4 mil. This reduced size permits TAB foil leads to be used on smaller, more closely spaced bonding pads of the increased density integrated circuits. For an overview of tape automated bonding technology, see T. G. O'Neill, "The Status of Tape Automated Bonding", *Semiconductor International,* February, 1981, pp. 33–51.

One of the requirements of TAB bonding is that there must be a small quantity of bonding or interconnecting material, commonly called a "bump" on either the bonding pad of the integrated circuit die or on the interior terminals of the TAB foil pattern leads. The bumps are typically gold or solder bumps that are electroplated onto the bonding pads. There has been some success with using the bumped tape to bond onto bonding pads of die which have no bumps. However, a considerable drawback to the TAB process is that of the high cost of learning to place bumps on the chip bonding pads or the TAB tape. Even after one has become accomplished at it, the bumping process can be expensive.

Thus, it would be desirable if a process could be developed whereby bumps could be formed on the bonding pads of a semiconductor die or on the TAB tape inexpensively. Even if such a process were time consuming, it would be advantageous to use for devices having low quantities but high per unit cost, or in further research and development of chip bonding processes.

SUMMARY OF THE INVENTION

Accordingly, it is an object of the present invention to provide a process for the bonding of integrated circuit die to a lead frame, TAB tape or other carrier having electrical connections to receive the die that does not require an expensive bumping process.

Another object of the invention is to provide a bonding process that employs readily available, relatively low cost technology, but permits the use of TAB tape.

An additional object of the present invention is to provide a low cost bonding process that is economical to use on a low volume basis.

In carrying out these and other objects of the invention, there is provided, in one form, a process for attaching an integrated circuit die to a die support frame having a conductive pattern thereon by first applying a plurality of balls, one each to a plurality of bonding pads on the integrated circuit die by using a readily available wire bonder to deposit a ball on each bonding pad and severing the wire close to the ball. Next, the balls on the surface of the integrated circuit die are planarized to provide a flat exposed surface on each ball. Then the flat exposed surfaces of the balls are coated with a conductive epoxy film, and the integrated circuit die is bonded to the die support frame in correspondence to the conductive pattern thereon.

DETAILED DESCRIPTION OF THE INVENTION

Figure 1:
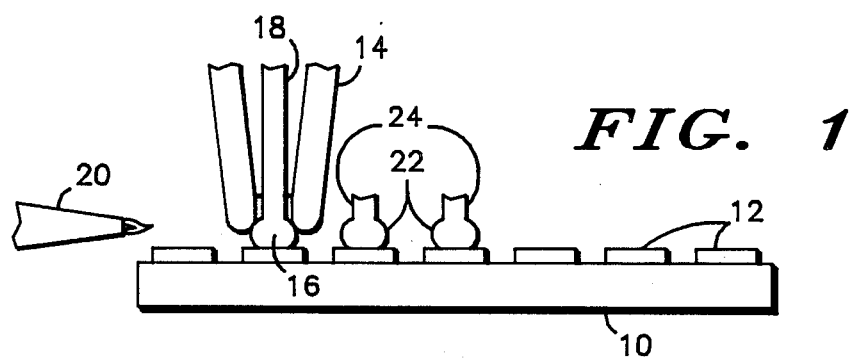
FIG. 1 is a detailed partial view of the step of forming balls on the bonding pads of an integrated circuit die in accordance with the process of the invention.

Shown in FIG. 1 is a side view of an integrated circuit die 10 having a plurality of bonding pads 12 on the top surface thereon. There are a number of well-known methods for forming bonding pads 12 on an integrated circuit, and it is expected that the process of the invention would work equally well with all of them. In accordance with the process of the invention, wire bond capillary 14, shown in partial section view, is in the process of depositing ball 16 on the surface of a bonding pad 12. Customarily, the ball is formed on the end of wire 18 being fed through capillary 14 by passing a hydrogen torch, schematically illustrated at 20, over the end of the wire 18, or by capacitance discharge. After ball 16 is attached firmly to the bonding pad 12, the capillary 14 is pulled away from the ball 16 a short distance, feeding out a small portion of wire 18 which is then broken or cut to form free balls 22 having wire stems 24. Forming balls by depositing them with a wire bonder and then cutting off the pendent wire is a known technique as seen in U.S. Pat. No. 4,285,002 to Campbell at col. 4, lines 14-26. However, that patent does not disclose the subsequent steps of the instant process.

Balls 22 may be any conductive material or metal that can be deformed and shaped into a ball or lump by pressure, heat, ultrasonic excitation, thermocompression or other technique. Common substances that could be used to make balls 22 are gold, aluminum and solder. Wire bonding equipment, such as that represented by wire bond capillary 14 is readily avaiable and relatively inexpensive relative to die bumping equipment used in TAB processes.

Figure 2:
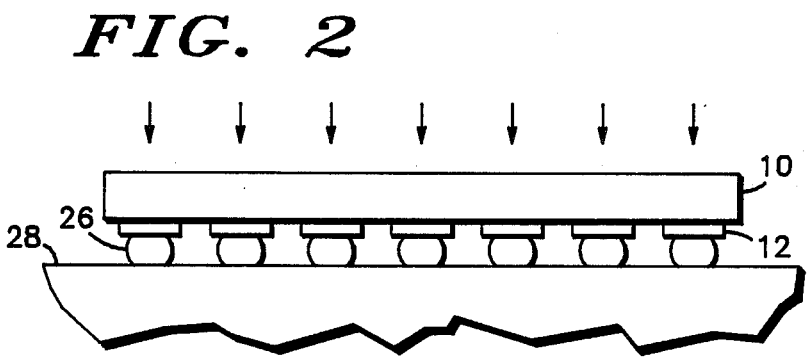
FIG. 2 is a side view of the use of force to planarize the bonding balls on a flat surface according to the process of the invention.

Shown in FIG. 2 is the integrated circuit die 10 having a plurality of bonding pads 12 with balls 26 thereon in the process of being planarized against smooth flat surface 28. By planarized, it is meant that the tops of the balls 26 are flattened to provide a smooth flat surface on each ball 26 that is in the same plane as the smooth flat surfaces on all other balls 26 on the chip 10. The irregularities caused by wire stems 24 are eliminated by this step. If the flat surfaces on balls 26 are not all in the same plane on the same chip, some of the necessary electrical connections may not be made with the leads on a die support frame when the bonding of the connections is performed. Lack of planarity of the bumps is a problem also for customary electroplated bumped chips, and is even more of a problem if bumped TAB tape is used if the tips of the individual leads are permitted to move independently of each other and are not braced by a support member.

In FIG. 2, the planarization is done by force as indicated by the downward pointing arrows. However the planarization could also be conducted by warming the balls 26 so that they would be soft or molten and thus susceptible to forming and flattening.

Figure 3:
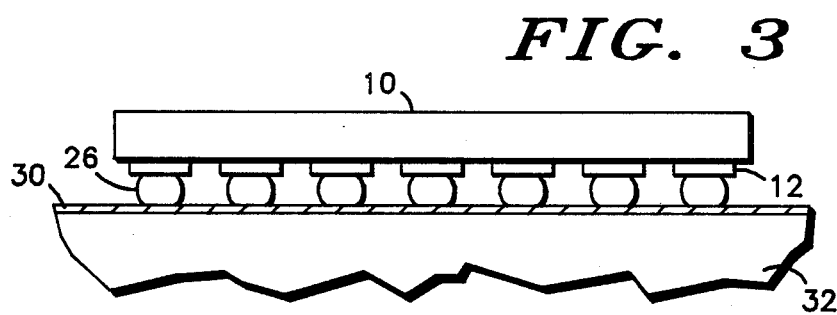
FIG. 3 is a side view of the simultaneous application of a conductive epoxy adhesive to the planarized surfaces of the balls.

Shown in FIG. 3 is one mode of application of a thin layer of epoxy 30 over the flat surfaces of the balls 16. In this embodiment, a thin layer of conductive epoxy 30 is laid out over flat surface 32 and the integrated circuit 10 is simply inserted upside down on the epoxy film 30 to contact the flat, planar surface of each ball 22. Other techniques may also be used to apply the conductive epoxy 30 to the planarized surfaces of the balls 22, such as individually applying the epoxy adhesive to each planarized surface.

The epoxy 30 may be any conductive adhesive. Generally, they include any liquid epoxy adhesive that will permanently form and set up a connection. These sorts of adhesives which have a high metal content are well known in the bonding art.

Figure 4:
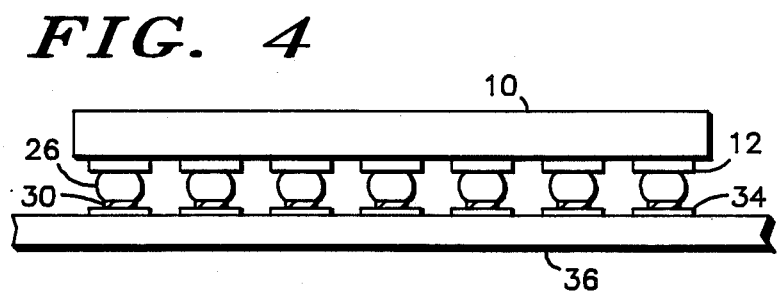
FIG. 4 is a side view of the integrated circuit die bonded to the die support frame in accordance with the last step of the inventive process.

The final step of the process of this invention is illustrated in FIG. 4 which shows the integrated circuit die 10 and its bonding pads 12 being permanently bonded to a conductive pattern 34 on die support frame 36 via planarized balls 26 and epoxy coating 30. Of course, care must be taken to ensure that the chip 10 is properly oriented and that bonding pads 12 correspond to and register with the appropriate portions of the conductive pattern 34 for the proper electrical connections. Care must also be taken to ensure that the epoxy adhesive 30 does not flow excessively and cause shorting between the leads.

As noted before, die support frame 36 may be a lead frame, a TAB tape or a transparent glass surface, as in a display application, and should not be limited to the particular form illustrated as an example only in FIG. 4. It should also be noted that the method of this invention can be adapted to be used on the metal pattern on an existing or standardized package.

It may be seen that the process of this invention is ideal for the low cost "bumping" and bonding of a plurality of integrated circuit die. All of the steps may be readily accomplished using available equipment. The method of the invention permits integrated circuit die to be put into TAB tape or other packaging configurations on an experimental or low volume level for testing purposes, or if the market for the particular device does not warrant tooling up a large scale bumping and TAB bonding operation. At the same time, the process is versatile enough to permit die bonding to a wide variety of die support frames.

I claim:

1. A process for attaching an integrated circuit die to a die support frame having a conductive pattern thereon comprising:
    attaching a plurality of balls, one each to a plurality of bonding pads on the integrated circuit die by using a wire bonder to deposit a ball on each bonding pad and severing the wire close to the ball;
    planarizing the balls attached to the surface of the integrated circuit die wherein the planarization is performed by force against a flat planarization surface exclusive of the support frame, to provide a flat exposed surface on each ball wherein the flat exposed surfaces are all in the same plane;
    coating only the flat exposed surfaces of the balls with a conductive epoxy film by placing the integrated circuit die having planarized balls in a thin film of the conductive epoxy; and
    adhering the integrated circuit to the die support frame in correspondence to the conductive pattern thereon by means of the conductive epoxy film on the flat surfaces of the balls.

2. The process of claim 1 in which the planarization step is performed by force against a flat planarization surface.

3. A process for attaching an integrated circuit die to a die support frame having a conductive pattern thereon comprising:
    applying a plurality of balls, one each to a plurality of bonding pads on the integrated circuit die by using a wire bonder to deposit a ball on each bonding pad and severing the wire close to the ball, wherein the material of the balls is selected from the group consisting of gold, aluminum, solder and alloys thereof;
    planarizing the balls on the surface of the integrated circuit die to provide a flat exposed surface on each ball;
    coating only the flat exposed surfaces of the balls with a conductive epoxy film by placing the integrated circuit die having planarized balls in a thin film of the conductive epoxy; and adhering the integrated circuit die to the die support frame in correspondence to the conductive pattern thereon, wherein the die support frame is selected from the group consisting of a glass plate, a ceramic package, a metal lead frame, and a TAB tape, by means of the conductive epoxy film wherein the only structure between the balls and the die support frame is the conductive epoxy film.

4. The process of claim 3 in which the planarization step is performed by force against a flat planarizing surface.

5. A process for attaching an integrated circuit die to a die support frame having a conductive pattern thereon comprising:

applying a plurality of balls, one each to a plurality of bonding pads on the integrated circuit die by using a wire bonder to deposit a ball on each bonding pad and severing the wire close to the ball, wherein the material of the balls is selected from the group consisting of gold, aluminum, solder and alloys thereof;

planarizing the balls on the surface of the integrated circuit die by force against a smooth, flat surface exclusive of the support frame to provide a flat exposed surface on each ball wherein the flat, exposed surfaces are all in the same plane;

simultaneously coating the flat exposed surfaces of the balls with an epoxy film by placing the integrated circuit die having planarized balls in a thin film of the conductive epoxy adhesive; and adhering the integrated circuit die to the die support frame in correspondence to the conductive pattern thereon, wherein the die support frame is selected from the group consisting of a glass plate, a ceramic package, a metal lead frame, and a TAB tape, and wherein the only structure between the die support frame and the balls is the conductive epoxy film, wherein the balls do not directly touch the conductive pattern.

* * * * *